United States Patent
Chen et al.

(10) Patent No.: US 6,407,443 B2
(45) Date of Patent: Jun. 18, 2002

(54) NANOSCALE PATTERNING FOR THE FORMATION OF EXTENSIVE WIRES

(75) Inventors: Yong Chen, Palo Alto; R. Stanley Williams, Mountain View, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/886,355

(22) Filed: Jun. 20, 2001

Related U.S. Application Data

(62) Division of application No. 09/516,989, filed on Mar. 1, 2000, now Pat. No. 6,290,450.

(51) Int. Cl.$^7$ .............................................. H01L 21/336
(52) U.S. Cl. ...................... 257/616; 257/624; 257/635; 257/768
(58) Field of Search .................... 257/616, 200, 257/619, 210, 623, 211, 624, 631, 635, 643, 742–744, 748, 753, 768, 771; 438/597, 689, 735, 738, 737

(56) References Cited

U.S. PATENT DOCUMENTS

| 5,210,425 A | * | 5/1993 | Delawski et al. | |
|---|---|---|---|---|
| 6,027,968 A | | 2/2000 | Nguyen et al. | 438/254 |
| 6,165,911 A | * | 12/2000 | Calveley | |

FOREIGN PATENT DOCUMENTS

| WO | WO99/46792 | 9/1999 |
|---|---|---|

OTHER PUBLICATIONS

Xiaoyun Sun, et al, "Multilayer Resist Methods For Nanoimprint Lithography On Nonflat Surfaces", 42nd Internantional Conference On Electron, Ion, and Photon Beam Technology and Nanofabrication, Chicago, Il, USA, May 26–29, 1998, vol. 16, No. 6, pp. 3922–3925, XP002176706.

* cited by examiner

*Primary Examiner*—Keith Christianson
*Assistant Examiner*—Yennhu B. Huynh

(57) ABSTRACT

A method for forming a platen useful for forming nanoscale wires for device applications comprises: (a) providing a substrate having a major surface; (b) forming a plurality of alternating layers of two dissimilar materials on the substrate to form a stack having a major surface parallel to that of the substrate; (c) cleaving the stack normal to its major surface to expose the plurality of alternating layers; and (d) etching the exposed plurality of alternating layers to a chosen depth using an etchant that etches one material at a different rate than the other material to thereby provide the surface with extensive strips of indentations and form the platen useful for molding masters for nano-imprinting technology. The pattern of the platen is then imprinted into a substrate comprising a softer material to form a negative of the pattern, which is then used in further processing to form nanowires. The nanoscale platen thus comprises a plurality of alternating layers of the two dissimilar materials, with the layers of one material etched relative the layers of the other material to form indentations of the one material. The platen is then oriented such that the indentations are perpendicular to a surface to be imprinted.

8 Claims, 1 Drawing Sheet

NANOSCALE PATTERNING FOR THE FORMATION OF EXTENSIVE WIRES

CROSS-REFERENCE TO RELATED APPLICATIONS

This is a divisional of copending application Ser. No. 09/516,989 filed on Mar. 1, 2000 now U.S. Pat. No. 6,290,450 which is hereby incorporated by reference herein.

The present application is related to application Ser. No. 09/280,048, entitled "Chemically Synthesized and Assembled Electronic Devices", filed on Mar. 29, 1999, which is directed to the formation of nanowires used for nanoscale computing and memory circuits. The present application is also related to applications Ser. No. 09/280,225, entitled "Molecular Wire Crossbar Interconnect (MWCI) for Signal Routing and Communications", Ser. No. 09/280,045, entitled "Molecular Wire Crossbar Logic (MWCL)", Ser. No. 09/280,189, entitled "Molecular Wire Crossbar Memory", and Ser. No. 09/280,188, entitled "Molecular Wire Transistor (MWT)", all also filed on Mar. 29, 1999, which are all directed to various aspects of memory and logic circuits utilized in nanocomputing.

TECHNICAL FIELD

The present invention is generally directed to nanoscale computing and memory circuits, and, more particularly, to the formation of nanowires for device applications.

BACKGROUND ART

With the constantly decreasing feature sizes of integrated-circuit devices, the need for increasingly fine, lithographically-defined patterning is limiting further advances of the technology. Consequently, a growing amount of effort is being devoted to self-assembly techniques to form nanoscale switching elements; see, e.g., C. P. Collier et al, "Electronically Configurable Molecular-Based Logic Gates", *Science*, Vol. 285, pp. 391–394 (Jul. 16, 1999). The self-assembled switching elements may be integrated on top of a Si integrated circuit so that they can be driven by conventional Si electronics in the underlying substrate. To address the switching elements, nanoscale interconnections or wires, with widths less than 10 nm and lengths exceeding 1 µm, are needed. The self-assembled wires connecting the conventional electronics to the self-assembled switching elements should be anchored at locations defined by the underlying circuitry and should be composed of materials compatible with Si integrated-circuit processing.

Recent reports have shown that catalytic decomposition of a Si-containing gas by a metal, such as Au or Fe, can form long "nanowires"; see, e.g., J. Westwater et al, "Growth of silicon nanowires via gold/silane vapor-liquid-solid reaction", *Journal of Vacuum Science and Technology B*, Vol. 15, pp. 554–557 (May/June 1997) and A. M. Morales et al, "A Laser Ablation Method for the Synthesis of Crystalline Semiconductor Nanowires", *Science*, Vol. 279, pp. 208–211 (Jan. 9, 1998). These studies were based on an earlier-developed technique frequently called the vapor-liquid-solid (VLS) mechanism. A liquid alloy droplet containing the metal and Si is located at the tip of the wire and moves along with the growing end of the wire. The wires may either be formed in the gas phase or anchored at one end on a substrate; see, e.g., J. L. Liu et al, "Gas-source MBE growth of freestanding Si nano-wires on Au/Si substrate", *Superlattices and Microstructures*, Vol. 25, No. ½, pp. 477–479 (1999). However, Au and Fe migrate into Si rapidly and create deep levels, which can degrade devices, such as addressing circuitry and other portions of the system formed by conventional Si integrated-circuit technology.

Titanium and $TiSi_2$ are compatible with integrated-circuit technology and are frequently used in Si circuits to reduce resistance of silicon and polycrystalline-silicon conducting regions. Although Ti forms deep levels in Si, its solubility and diffusion coefficient in Si are low, and the deep levels are not at mid-gap. With suitable handling, Ti is generally accepted in integrated-circuit facilities.

Long, thin "nanowires" of silicon or other materials, such as carbon, can be formed by catalyst-enhanced reaction of gaseous precursors; see, e.g., the above-mentioned patent application Ser. No. 09/280,048. The catalysts are often metal-containing nanoparticles either on the surface of a substrate or suspended in the reactor ambient. The nanowires may be useful in electronic or other devices as either connections to an electronic element such as a switch or as electronic elements themselves; see, e.g., the above-mentioned patent applications Ser. Nos. 09/280,225, 09/280,045, 09/280,189, and 09/280,188. However, it is difficult to control the placement of these free-standing wires, and therefore it is difficult to use these nanowires in real integrated circuits.

The fabrication of nanowires is important for device applications, such as logic circuits, crossbar memories, etc. Two lithographic fabrication approaches that have been used on larger scale devices include electron beams and X-rays. The typical size of an electron beam is about 20 nm, and would require rastering the beam over a surface. The typical size of an X-ray beam is about 50 nm, and there are no lenses available to focus an X-ray beam. Also, the use of X-rays requires a synchrotron, and thus is very expensive. Neither approach permits generation and use of a beam on the order of 10 nm, which is required for nanowire fabrication.

In either event, it is not presently possible to achieve critical dimensions in patterning down to 10 nm. The present invention solves this problem, enabling the fabrication of nanowires with widths below 10 nm and with lengths extending into microscale dimensions, thereby avoiding the difficulties of rastering and the cost of a synchrotron, while permitting more accurate control of the placement of the nanowires.

DISCLOSURE OF INVENTION

In accordance with the present invention, a method is provided for forming a platen useful for forming nanoscale wires for device applications. The method comprises:

(a) providing a substrate having a major surface;

(b) forming a plurality of alternating layers of two dissimilar materials on the substrate to form a stack having a major surface parallel to that of the substrate;

(c) cleaving the stack normal to the major surface to expose the plurality of alternating layers; and (d) etching the exposed plurality of alternating layers to a chosen depth using an etchant that etches one material at a different rate than the other material to thereby provide the surface with extensive strips of indentations and form the platen useful for molding masters for nano-imprinting technology.

The pattern of the platen is then transferred into a substrate comprising a softer material to form a negative of the pattern, which is then used in further processing.

Also in accordance with the present invention. a nano-imprinting device, or platen, comprises a plurality of alternating layers of the two dissimilar materials, with the layers of one material etched relative the layers of the other material to form indentations of the one material. Each material independently has a thickness within a range of about 0.4 nm to several hundred nm. The device is then oriented such that the indentations are perpendicular to a surface to be imprinted and the pattern created by the indentations is into the surface.

The fabrication of nanowires disclosed and claimed herein avoids most, if not all, of the problems of the prior art.

BEST MODES FOR CARRYING OUT THE INVENTION

Figure 1:
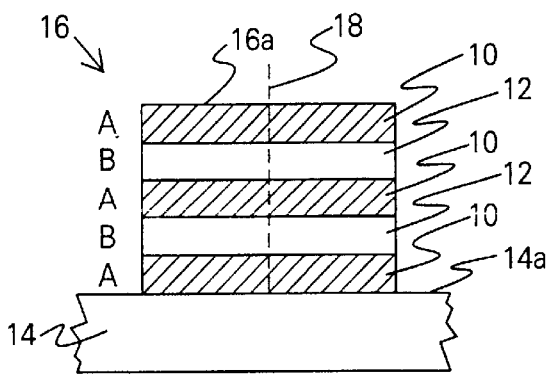
FIG. 1 is a cross-sectional view of a plurality of alternating layers of two materials, forming a stack on a major surface of a substrate and showing a cleaving surface.

Nanoscale strips for device applications are fabricated by depositing composite thin films with different materials A and B, as illustrated in FIG. 1. Essentially, as described in greater detail below, a plurality of alternating layers of A material 10 and B material 12 are deposited on a major surface 14a of a substrate 14 to form a stack 16, also having a major surface 16a, parallel to the major surface of the substrate. Preferably, the material having the least lattice mis-match with the substrate 14 is deposited in order to keep a smooth growth surface and flat, sharp interfaces between materials 10 and 12.

Figure 2:
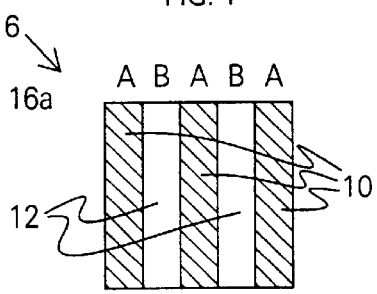
FIG. 2 is a cross-sectional view of the stack rotated 90 degrees so as to place the cleaved surface facing downward.

The layers 10, 12 are then cleaved along a line 18 normal to the major surface 16a of the stack 16 to expose the cross-section, as shown in FIG. 2. Cleaving is performed by any conventional technique useful in cleaving a plurality of alternating layers of dissimilar materials. Such techniques are well-known in the art for the materials used for layers A and B, which are discussed below.

Figure 3:
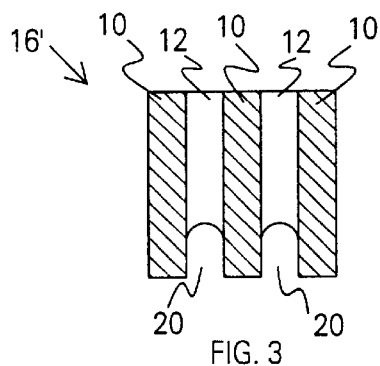
FIG. 3 is a view similar to that of FIG. 2, but showing the effects of partially etching one of the materials relative to the other.

The material B, layer 12, is then etched to a certain depth, as shown in FIG. 3, and as more fully described below, thereby providing the surface with extensive strips of indentations, shown by arrows 20. Thus, the second, fourth, sixth, etc. layers from the substrate are etched.

Figure 4:
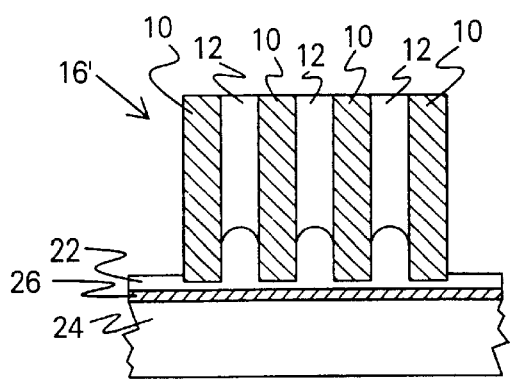
FIG. 4 is a view similar to that of FIG. 3, showing use of the etched stack as a molding master for nano-imprinting in a material that is softer than the etched material, depicting one embodiment of performing the nano-imprinting, using a thin (nanometer scale) metal layer on a substrate.
Figure 8:
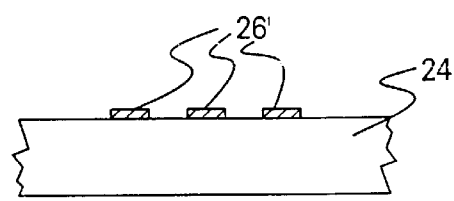
FIG. 8 is a view similar to that of FIG. 7, following removal of the remaining softer material to expose a plurality of parallel nano-wires.

The indentations 20 can be used as a platen 16' to mold a master in layer 22 for nano-imprinting technology, as illustrated in FIG. 4. The layer 22 may comprise a thermoplastic polymer, for example, formed on a substrate 24, which may comprise a semiconductor or metal material. The pattern of the polymer nanowires formed in layer 22, shown in FIG. 5, can then be transferred to metal and/or semiconductor nanowires by using conventional lithographic and ink printing processes; see, e.g., X. Sun et al, "Multilayer resist methods for nanoimprint lithography on nonflat surfaces", Journal of *Vacuum Science and Technology*, Vol. B16, No. 6, pp. 3922–3925 (1998).

Examples of A and B materials are set forth in Table I below.

TABLE I

Examples of A and B Materials.

| A MATERIAL | B MATERIAL | SUBSTRATE |
| --- | --- | --- |
| Si | Si—Ge alloy | Si |
| AlGaAs | GaAs | GaAs |

Other semiconductor combinations may also be used, so long as there is a differential etching rate between the A and B materials. The etching rate of one material relative to the other is immaterial, except that the B material must etch at a faster rate than the A material. Preferably, a differential etching rate of more than five times faster is employed in order to minimize the amount of etching of the A material.

Where the silicon-germanium alloy is used as material B, the concentration of silicon ranges from about 70 to 90 atomic percent (at %), and the balance (30 to 10 at %) is germanium. Where the aluminum gallium arsenide alloy is used as material A, the concentration of Al ranges from a few percent to 100 at % (AlAs). The alloy is represented as $Al_xGa_{1-x}As$, where x ranges from a few at % to 100 at %.

The two layers 10, 12 each independently have a thickness range of about 0.4 nm to several hundred nm, and are conveniently deposited by chemical vapor deposition (CVD), using organo-silanes and organo-germanes (for the Si/Si—Ge system) or appropriate precursors for AlGaAs and GaAs, as is well-known. Molecular beam epitaxy (MBE) may be alternatively employed in the depositions of the two materials, using well-known procedures. The particular method of forming the A and B layers does not form a part of the present invention.

The two materials A and B are conveniently deposited on a semiconductor substrate, silicon in the case of the Si/Si—Ge system or gallium arsenide in the case of the AlGaAs/GaAs system (see Table I). In any semiconductor system employing a semiconductor substrate on which semiconductor layers are deposited, lattice mis-match is always a consideration, and selection of substrate and materials A and B will be dictated by minimizing the strain resulting from lattice mis-match. Such a determination is easily within the ability of the person skilled in this art, and therefore does not constitute undue experimentation.

Layers of the A and B materials are deposited on the substrate in alternating fashion, each layer having a thickness within the range listed above. The number of A and B layers depends on the requirement for the devices—a large number of devices requires many wires in parallel, while a smaller number of devices requires fewer wires in parallel. Typically the number of A and B layers is within the range of a few layers of each material to several thousand layers of each material.

It will be appreciated by those skilled in this art that, based on the teachings herein, the A and B layers can be formed with varying thicknesses, for making nonperiodic arrays of wires. For example, wires and spacings of different widths and aperiodic structures may be formed in accordance with the teachings of the present invention. Such aperiodic arrays are useful, for example, for making blocks of crossbars with larger wires for multiplexing.

The etching of the two materials A and B is advantageously performed by chemical etching, and known etchants are employed that have the requisite etch rate differential between the two materials used. The depth of etching (indentations 20) may range from several nm to several hundred nm, and depends on the requirement of the height of the nanowires ultimately formed by nano-imprinting.

Nano-imprinting, as used herein, involves pressing a platen 16' into a softer material 22, such as a thermoplastic polymer, thereby transferring a negative of the pattern formed by the indentations 18 into the softer material. Examples of suitable thermoplastic materials include polymethyl methacrylate (PMMA) and methyl methacrylate (MMA). However, other thermoplastic materials and, indeed, materials other than thermoplastic materials may be employed in the practice of the present invention, so long as the material 22 is softer than that of the platen 16'.

The resulting imprinted pattern, imprinted by the platen 16' into the softer material 22, is then transferred into a substrate, e.g., semiconductor or metal, as a positive image of the platen. The transferred pattern can then be used for further processing in the formation of nanoscale devices.

There are many ways of transferring the pattern into a substrate. FIGS. 4–8 depict one such method, but it will be understood that the present invention is not so limited. As shown in FIG. 4, prior to forming the soft material 22 on the substrate 24, a thin metal layer 26 is first formed on the substrate, followed by formation of the soft material thereon. The thickness of the thin metal layer 26 is in the nanoscale region, that is, on the order of several nanometers to hundreds of nanometers.

Figure 5:
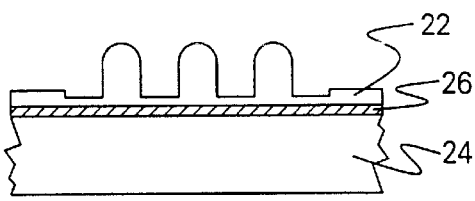
FIG. 5 is a view similar to that of FIG. 4, showing the negative formed in the softer material.
Figure 6:
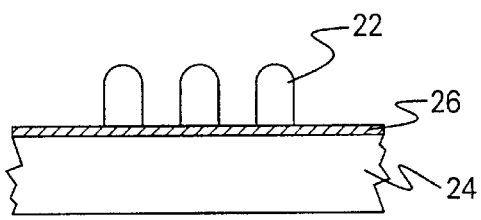
FIG. 6 is a view similar to that of FIG. 5, following etching of the thin polymer residual layers to expose portions of the thin metal layer.

After imprinting the pattern into the soft material 22, as shown in FIG. 5, the thinner portions of the soft material 22 are removed, such as by etching with an etchant that removes the soft material but does not etch the metal layer 26, thereby exposing portions of the thin metal layer. This step is depicted in FIG. 6.

Figure 7:
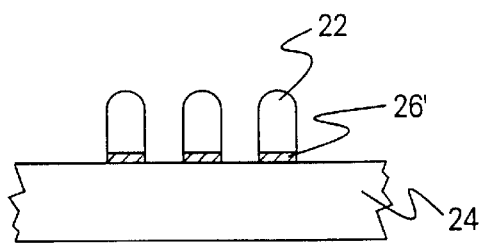
FIG. 7 is a view similar to that of FIG. 6, following etching of the exposed portions of the thin metal layer.

Next, the exposed portions of the metal layer 26 are removed, leaving behind those portions 26' of the metal layer covered by the soft material 22, as shown in FIG. 7. The remaining soft material 22 is then removed, leaving a plurality of parallel metal lines 26' on the surface of the substrate 24. The metal lines 26', being of nanoscale thickness, are then further processed to form nanoscale devices, as taught elsewhere.

The foregoing method is directed to the formation of a plurality of alternating layers 10, 12, used to form a platen 16'. The particular method of forming the plurality of alternating layers 10, 12 is immaterial to the method of the present invention, although two processes, CVD and MBE, are mentioned above. An alternate technique, called "spontaneous ordering" is an example of another process useful in the practice of the present invention. Spontaneous ordering is discussed, for example, by Z. Lilienthal-Weber et al, "Spontaneous Ordering in Bulk GaN:Mg Samples", *Physical Review Letters*, Vol. 83, No. 12, pp. 2370–2373 (Sep. 20, 1999). In spontaneous ordering, one material with a homogeneous structure (or concentration) can decompose and form a superlattice with alternating layers of two or more dissimilar materials with different structures (or concentrations). For example, in Mg-doped GaN single crystals, the magnesium atoms in GaN tend to concentrate and form regular periodic thin Mg-rich layers buried in GaN. These periodic superlattices formed by spontaneous ordering can also be to form the platen 16'.

INDUSTRIAL APPLICABILITY

The method of nanoscale patterning for the formation of extensive nanowires is expected to find use in nanoscale computing and memory circuits.

What is claimed is:

1. A nano-imprinting device for molding a plurality of nanoscale wires, said device comprising a plurality of alternating layers of two dissimilar materials, said layers of one material etched laterally from one end relative to said layers of the other material to form indentations of said one material at said one end, with said device oriented such that said indentations are perpendicular to a surface to be imprinted, wherein each said material independently has a thickness within a range of about 0.4 nm to less than 1 $\mu$m.

2. The device of claim 1 wherein one material has a depth of etching within a range of greater than 1 nm to less than 1 $\mu$m relative to said other material.

3. The device of claim 1 wherein said two dissimilar materials are selected from the group consisting of silicon/silicon-germaniun alloy and aluminum gallium arsenide/gallium arsenide.

4. The device of claim 3 wherein said silicon-germaniun alloy comprises about 70 to 90 wt % silicon and 30 to 10 wt % germanium.

5. The device of claim 3 wherein said aluminum gallium arsenide comprises $Al_xGa_{1-x}As$, where x ranges from about a few at % to 100 at %.

6. The device of claim 1 wherein all layers of one material have a first uniform thickness and all layers of the other material have a second uniform thickness, which may or may not be the same as said first uniform thickness.

7. The device of claim 1 wherein all layers of each said material have different thicknesses with respect to each other.

8. The device of claim 1 wherein said plurality of alternating layers ranges from a few layers of each said material to several thousand layers of each said material.

* * * * *